(12) United States Patent
Teng et al.

(10) Patent No.: US 7,538,024 B2
(45) Date of Patent: May 26, 2009

(54) METHOD OF FABRICATING A DUAL-DAMASCENE COPPER STRUCTURE

(75) Inventors: Hsien-Che Teng, Tai-Nan (TW); Chin-Fu Lin, Tai-Nan (TW); Meng-Chi Chen, Tai-Nan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 159 days.

(21) Appl. No.: 10/908,229

(22) Filed: May 3, 2005

(65) Prior Publication Data

US 2006/0252250 A1    Nov. 9, 2006

(51) Int. Cl.
    *H01L 21/4763* (2006.01)
(52) U.S. Cl. .............. 438/627; 257/E21.579; 438/538; 438/687
(58) Field of Classification Search .......... 438/687, 438/627, 638; 257/E21.579
    See application file for complete search history.

(56) References Cited

U.S. PATENT DOCUMENTS

| | | | |
|---|---|---|---|
| 5,985,758 A * | 11/1999 | Kim | 438/653 |
| 6,326,306 B1 | 12/2001 | Lin | |
| 6,403,465 B1 | 6/2002 | Liu et al. | |
| 6,586,334 B2 | 7/2003 | Jiang | |
| 6,764,945 B2 | 7/2004 | Ashihara et al. | |
| 6,838,772 B2 | 1/2005 | Saitoh | |
| 2002/0106846 A1 | 8/2002 | Seutter et al. | |
| 2003/0060042 A1* | 3/2003 | Park et al. | 438/653 |
| 2004/0038522 A1* | 2/2004 | Ahn | 438/637 |
| 2004/0266175 A1* | 12/2004 | Chen et al. | 438/629 |
| 2006/0113675 A1* | 6/2006 | Chang et al. | 257/763 |

FOREIGN PATENT DOCUMENTS

CN    1458689 A    11/2003

OTHER PUBLICATIONS

Quirk, Michael and Julian Serda, Semiconductor Manufacturing Technology, Prentice Hall, 2001, pp. 314 and 320.*
D. Edelstein. et al, "A high performance liner for copper damascene interconnects", Interconnect Technology Conference, 2001. Proceedings of the IEEE 2001 Internation, pp. 9-11.

* cited by examiner

*Primary Examiner*—Asok K Sarkar
(74) *Attorney, Agent, or Firm*—Winston Hsu

(57) ABSTRACT

A method for fabricating a dual-damascene copper structure includes providing a semiconductor substrate having a dielectric layer thereon and a dual-damascene hole positioned in the dielectric layer, wherein a portion of the semiconductor substrate is exposed in the dual-damascene hole. A PVD process and an atomic CVD process are sequentially performed to form a substrate-protecting layer and a tantalum nitride layer in the dual-damascene hole. And then a copper layer is formed in the dual-damascene hole.

21 Claims, 10 Drawing Sheets

METHOD OF FABRICATING A DUAL-DAMASCENE COPPER STRUCTURE

BACKGROUND OF INVENTION

1. Field of the Invention

The invention relates to a method of fabricating a dual-damascene copper structure, and more particularly, to a method of fabricating a dual-damascene copper structure through an atomic chemical vapor deposition (CVD) process to form a barrier layer.

2. Description of the Prior Art

With the increasing complexity of integrated circuits, the multilevel interconnect process has become the typical method used in semiconductor integrated circuit fabrication. To satisfy the requirements for high integration and high speed in integrated circuits (ICs), especially in a deep sub-micro (<0.18 μm) semiconductor process, a copper (Cu) dual damascene process is becoming more widely used as a standard process in forming an interconnection line within the inter-metal dielectric layer of low dielectric constant (low k) materials. Since copper has both a low resistance and a low electromigration resistance, the low k materials are useful in improving the RC delay effect of a metal interconnection.

Please refer to FIG. 1, which is a cross-sectional view of a semiconductor wafer 10 with a typical dual-damascene copper structure 11. As shown in FIG. 1, the dual-damascene copper structure 11 formed within a dielectric layer 20 comprises a dual-damascene hole 21 and conductive materials filled in the dual-damascene hole 21. The dual-damascene hole 21 is composed of a via 22 and a trench 23. An underlying metal wire 14 is formed in a dielectric layer 12 beneath the via 22. A Cu conductive layer or a upper metal wire 24 fills the trench 23 and is electrically connected with the underlying metal wire 14 by the via plug 22a and through the dielectric layer 12, the dielectric layer 20, and the passivation layer 18. In addition, the dual-damascene copper structure 11 can be used for electrically connecting the electric device on the silicon substrate of the semiconductor wafer 10 and upper metal wires, while the via plug directly contacts the surface of the silicon substrate.

To avoid diffusion of copper atoms from the dual-damascene copper structure 11 to the adjacent dielectric layer 20 resulting in current leakages, a barrier layer 25 is generally formed on the surface of the dual-damascene hole 21 before filling copper in the dual-damascene hole 21. A suitable material used to form the barrier layer 25 must possess the following requirements: (1) ability to block copper atoms, (2) good adhesion to Cu and the dielectric layer, (3) low resistance, and (4) good step coverage. Therefore, titanium (Ti), titanium nitride (TiN), tantalum nitride (TaN), tungsten nitride (WN), etc. are typically used to form the barrier layer. As a result, to form a barrier layer that can effectively prevent copper atoms from diffusing is one of the important keys for the dual-damascene copper structure.

In the prior art, U.S. Pat. No. 6,403,465 entitled "Method to Improve Copper Barrier Properties" discloses a method of fabricating a dual-damascene copper structure with improved barrier layer. The patent teaches a method comprising performing an in-situ physical vapor deposition (PVD) process or chemical vapor deposition (CVD) to form a barrier layer in the dual-damascene hole along with an ion-metal-plasma (IMP) deposition to form an adhesion layer before filling the copper layer in the dual-damascene hole so that a combined adhesion/barrier layer is formed in the surface of the dual-damascene hole. In this prior art, the barrier layer is composed of titanium nitride, tungsten nitride, tungsten silicon nitride, tantalum silicon nitride, or titanium silicon nitride. After forming the barrier layer, a metal seed layer is formed in the dual-damascene hole for forming a copper layer.

However, as the integration of chips increases, the prior-art technology for fabricating the dual-damascene copper structures causes some problems. Especially when the line width is less than 65 nanometers (nm), the barrier layer formed through the conventional PVD or CVD process has bad step coverage ability and bad conformance, resulting in bad performance of preventing copper atoms from diffusing. For instance, the titanium nitride layer formed through a conventional PVD process serving as a barrier layer cannot block copper atoms diffusing effectively, and that results in current leakages. Furthermore, when the conventional barrier layer does not have good conformance, the problem that the barrier layer and copper layer cannot fully fill the dual-damascene hole may occur, which also causes defects of via plugs. For solving these problems, manufacturers have researched and designed an atomic CVD process to form a tantalum nitride layer that has better ability for blocking copper atoms when serving as a barrier layer. However, when the dual-damascene copper structure is fabricated directly on a silicon substrate, the precursor of the atomic CVD process for forming the tantalum nitride layer causes damage of the silicon substrate or defects of electric devices on the silicon substrate. In addition, the seed layer of coppers has bad adhesion ability to the tantalum nitride layer formed through the atomic CVD process so as to influence the following processes of forming the copper layer and other devices.

SUMMARY OF INVENTION

It is therefore a primary objective of the claimed invention to provide a method for fabricating a dual-damascene copper structure which forms a substrate-protecting layer under the barrier layer and forms the barrier layer under specific conditions to solve the above-mentioned problem.

According to the claimed invention, the method of fabricating a dual-damascene copper structure comprises providing a semiconductor substrate having at least a dielectric layer thereon and at least a dual-damascene hole positioned in the dielectric layer, wherein a portion of the semiconductor substrate is exposed in a bottom of the dual-damascene hole. Then a PVD process is performed to form a conductive substrate-protecting layer on the exposed portion of the substrate and a sidewall of the dual-damascene hole. After that, an atomic CVD process is performed to form a tantalum nitride layer on the surface of the substrate-protecting layer, which serves as a barrier layer. Finally, a copper layer is formed in the dual-damascene hole.

It is an advantage of the claimed invention that the present invention method comprises forming a substrate-protecting layer on the exposed semiconductor substrate through a PVD process before forming the tantalum nitride layer formed by the atomic CVD process. Therefore the damage of the semiconductor substrate caused by the precursor of the atomic CVD process can be avoided. In addition, the tantalum nitride layer formed by the atomic CVD layer has a better step coverage and a preferable ability to block copper atoms. As a result, the dual-damascene copper structure formed by the present invention method has preferable performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
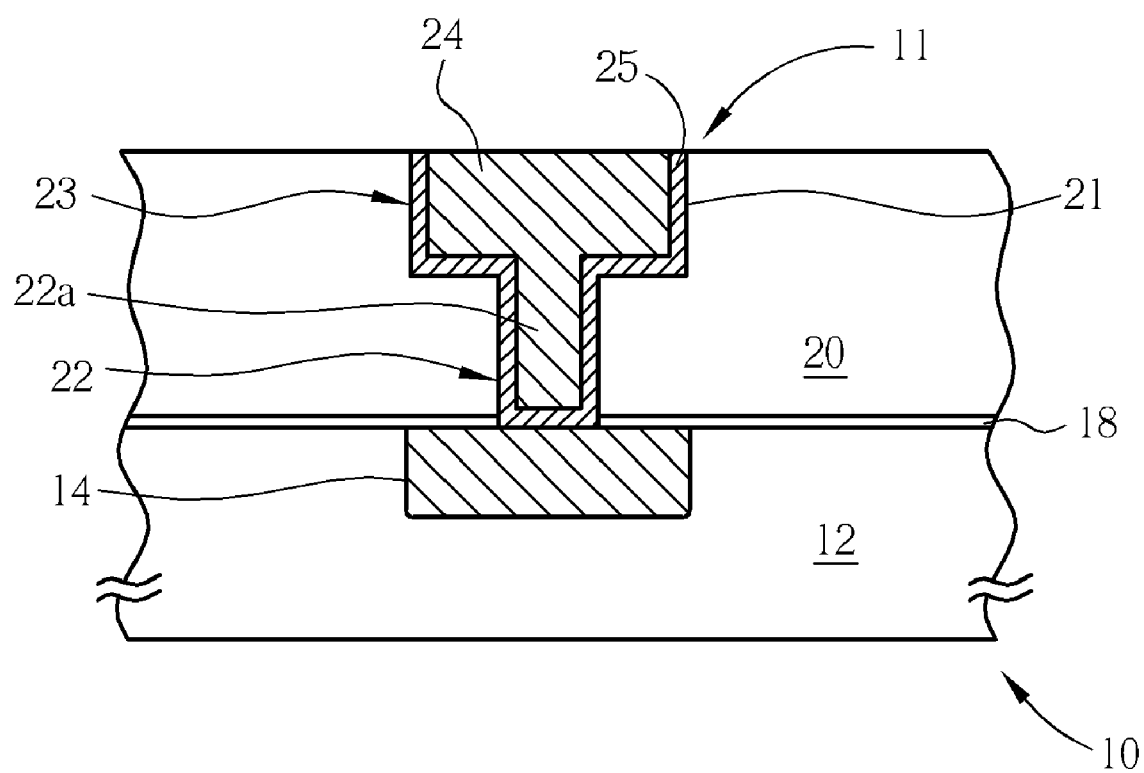
FIG. 1 is a cross-sectional view of a semiconductor wafer with a typical dual-damascene copper structure.
Figure 2:
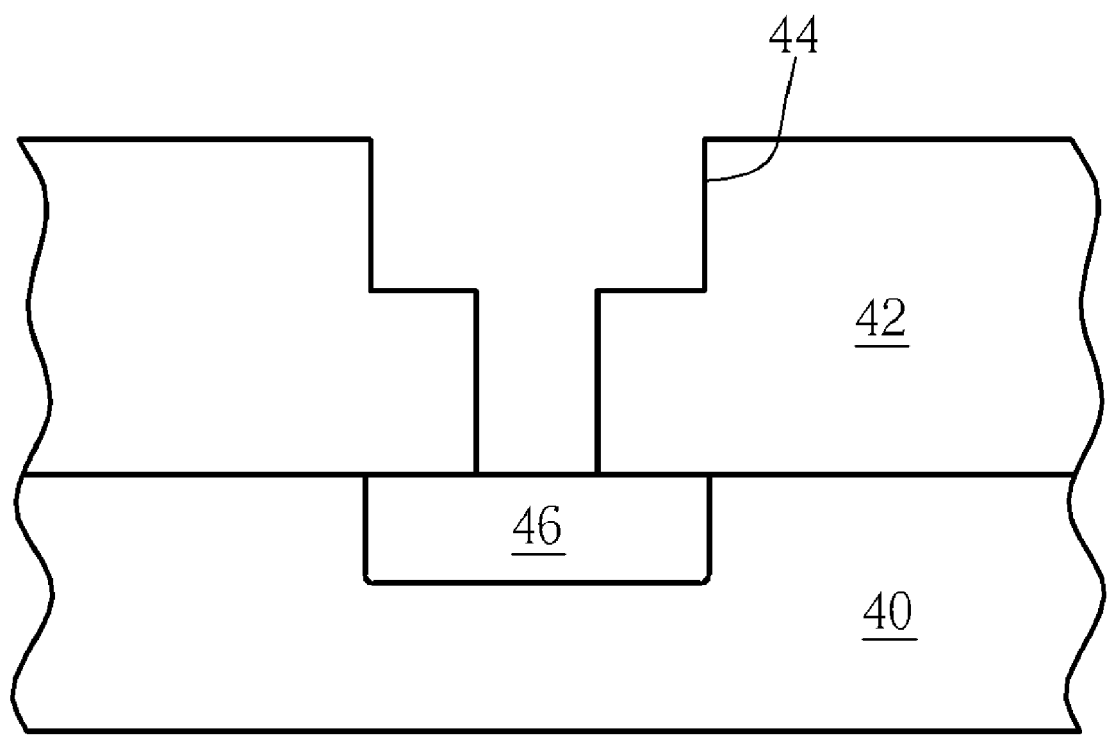
FIGS. 2-8 are schematic views of forming a dual-damascene copper structure according to the present invention.

Please refer to FIGS. 2-8. FIGS. 2-8 are schematic views of forming a dual-damascene copper structure according to the present invention, wherein the dual-damascene copper structure of this embodiment is fabricated directly on a semiconductor substrate. First, a semiconductor substrate 40 is provided, wherein the semiconductor substrate 40 is a silicon substrate. The semiconductor substrate 40 has at least a dielectric layer 42 thereon, and FIG. 2 only shows a dielectric layer 42 for clarity. Then, a dual-damascene hole 44 is formed in the dielectric layer 42. As shown in FIG. 2, the bottom of the dual-damascene hole 44 exposes a portion of the semiconductor substrate 40. The surface of the exposed portion of the semiconductor substrate 40 may further comprise a conductive layer 46 composed of silicide or an ion doped region.

Figure 3:
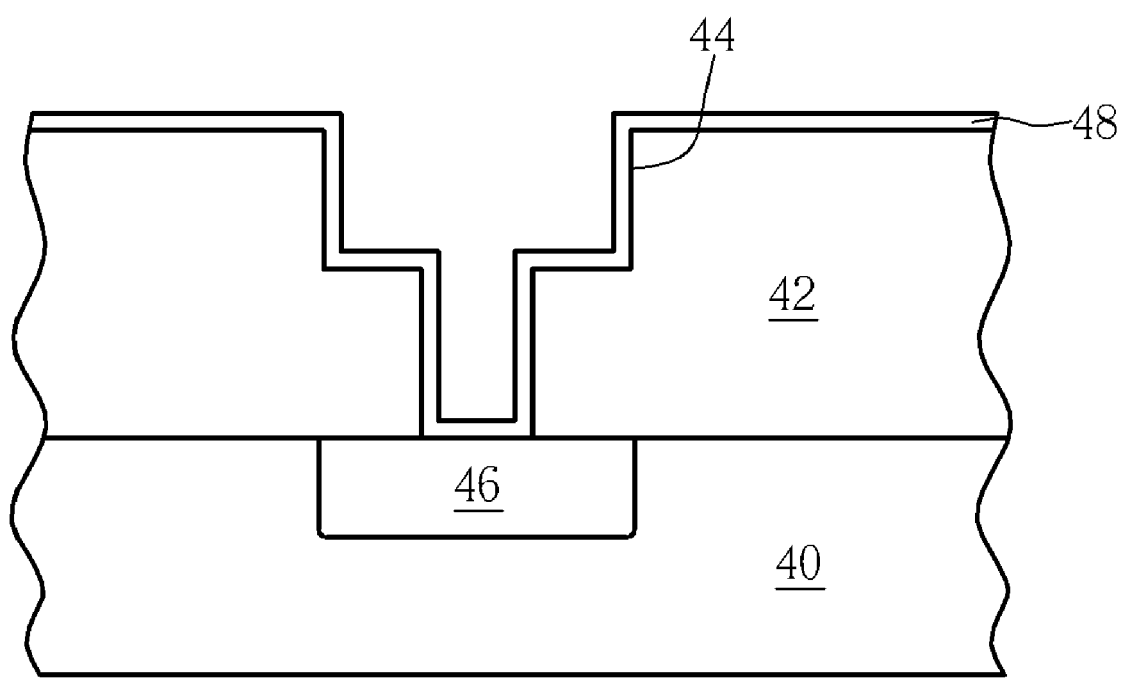
Figure 4:
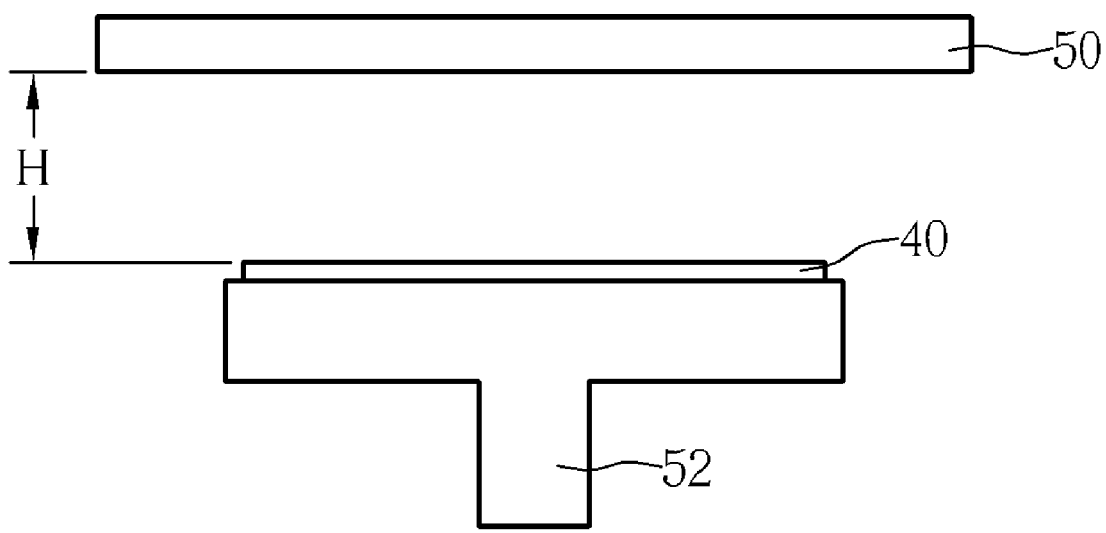

As shown in FIG. 3, a PVD process is next performed to form a substrate-protecting layer 48 on the surfaces of the sidewall of the dual-damascene hole 44 and the exposed semiconductor substrate 40, wherein the substrate-protecting layer 48 is composed of conductive materials, such as titanium (Ti), tantalum (Ta), or tantalum nitride. Among these conductive materials, tantalum is preferable. In a preferable embodiment of this present invention, a sputtering process is adopted to fabricate the substrate-protecting layer 48. Please refer to FIG. 4, which is a schematic diagram of a reaction chamber of the sputtering process used to form the substrate-protecting layer 48. The semiconductor substrate 40, which is a wafer, is positioned on a wafer shelf 52. A target 50 containing a material of the substrate-protecting layer 48, such as tantalum, is positioned above the wafer shelf 52. When performing the sputtering process, the distance $H_1$ between the target 50 and the semiconductor substrate 40 is more than 5 centimeters (cm) for forming the substrate-protecting layer 48 with preferable step coverage and better conformance.

Figure 5:
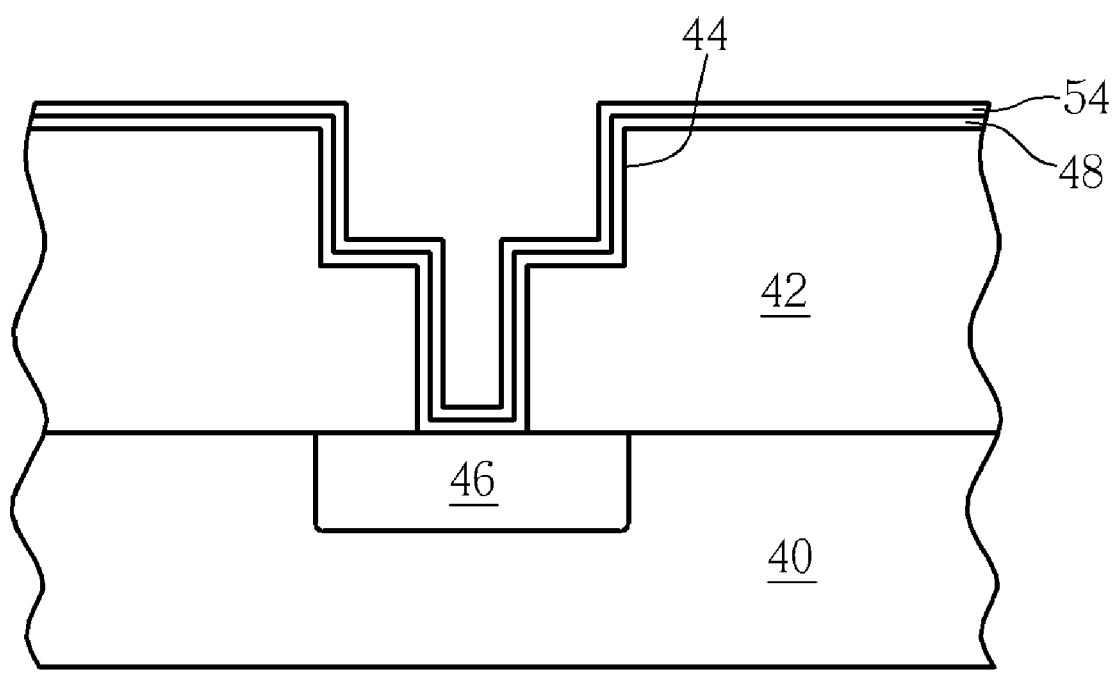

Referring to FIG. 5, an atomic CVD process is performed to form a tantalum nitride layer 54 on the surface of the substrate-protecting layer for serving as a barrier layer of copper. The precursor of the atomic CVD process comprises pentakis(dimethylamido) tantalum (PDMAT, $Ta(N(Me)_2)_5$) and ammonia ($NH_3$), and the atomic CVD process is performed under a temperature of about 180-400° C. During the atomic CVD process, ammonia is first introduced into the reaction chamber for several seconds. Then, PDMAT is introduced into the reaction chamber and purged. After that, ammonia and PDMAT are introduced into the reaction chamber in turn for several cycles to make ammonia displace tantalum nitride out of PDMAT for depositing tantalum nitride on surfaces of the dielectric layer 42 and the dual-damascene hole 44 until the predetermined thickness of the tantalum nitride layer 54 is reached. During each cycle, about 0.5-1 angstroms (Å) of the tantalum nitride layer 54 is deposited.

Figure 6:
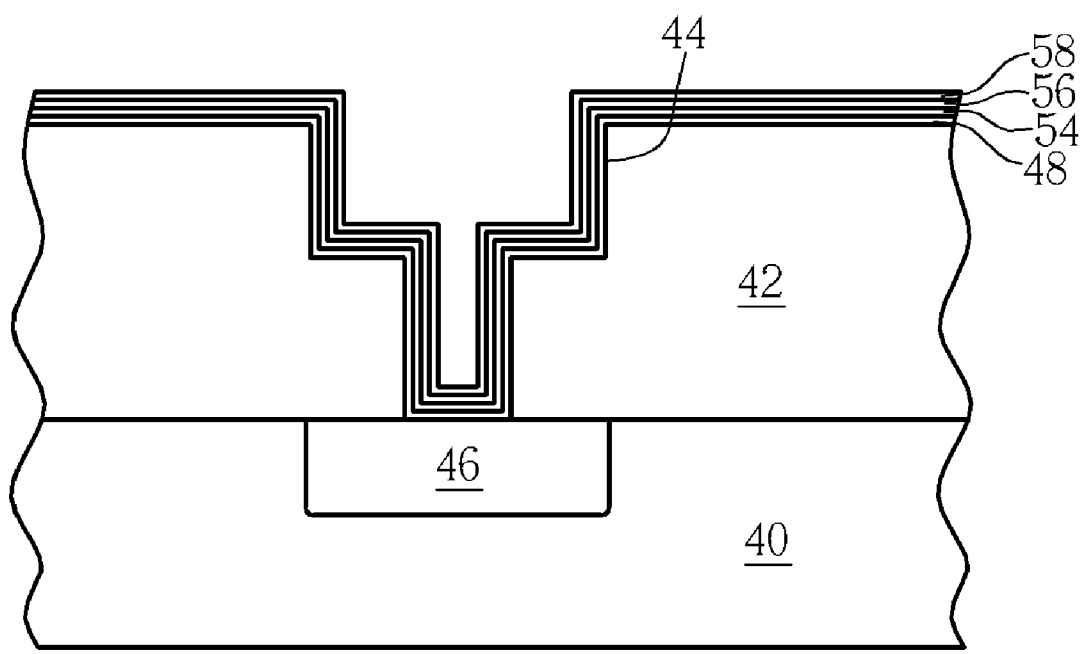
Figure 7:
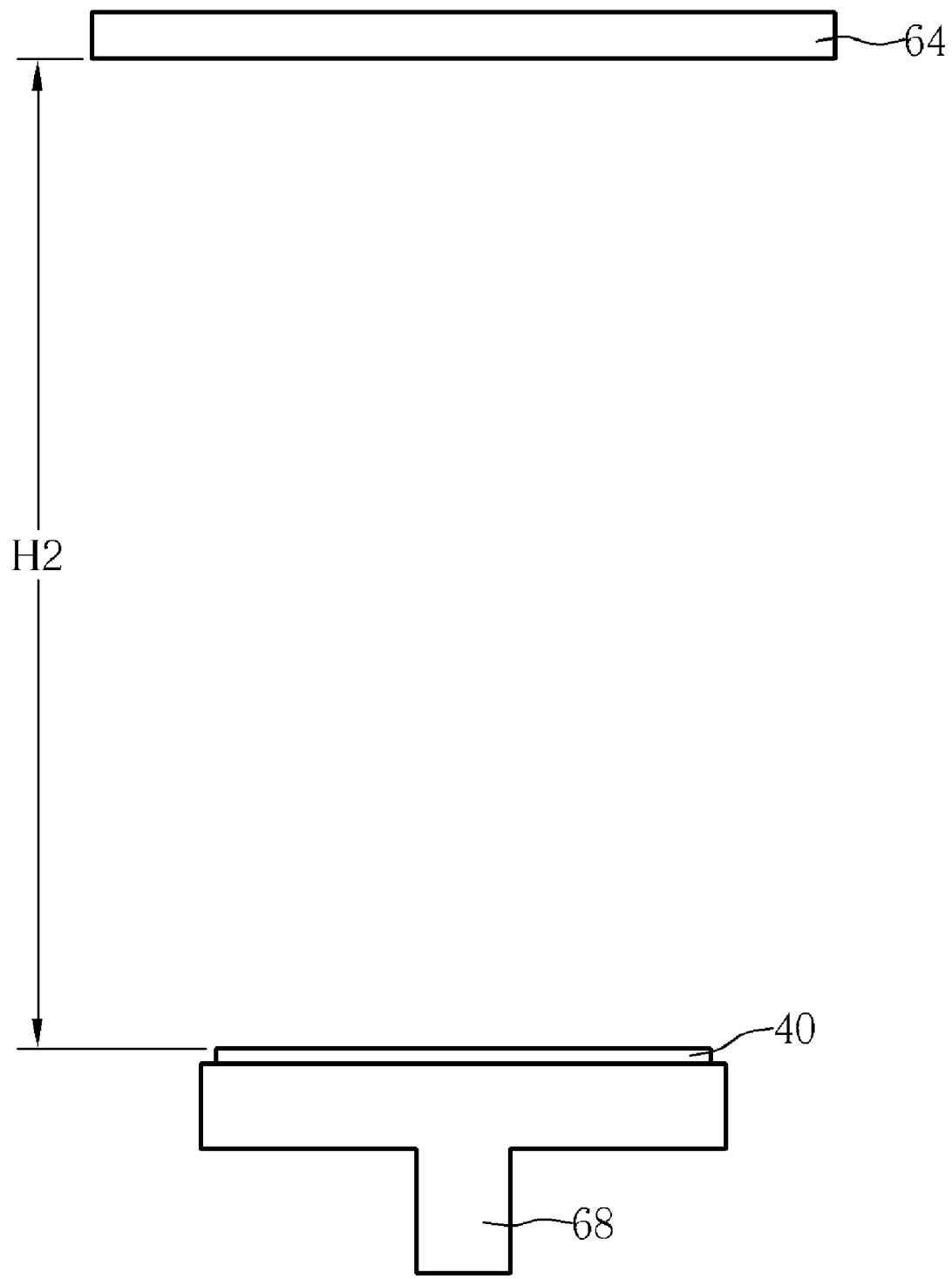

Please refer to FIG. 6. A PVD process is selectively performed to form an adhesion layer 56 on the surface of the tantalum nitride layer 54, wherein the adhesion layer 56 is preferably composed of tantalum. Then, a seed layer 58 is deposited on the surface of the adhesion layer 56 through an IMP, PVD, or CVD process for later forming a copper layer. It should be noted that the function of the adhesion layer 56 is to make the seed layer 58 firmly adhere along the sidewall and bottom of the dual-damascene hole 44. Please refer to FIG. 7. During the PVD process for forming the adhesion layer 56, the metal target 64 in the sputtering chamber has a distance $H_2$ away from the semiconductor substrate 40 and the wafer shelf 68 of 10-50 cm, as shown in FIG. 7. Under this process condition, the adhesion layer 56 has a preferable conformance.

Figure 8:
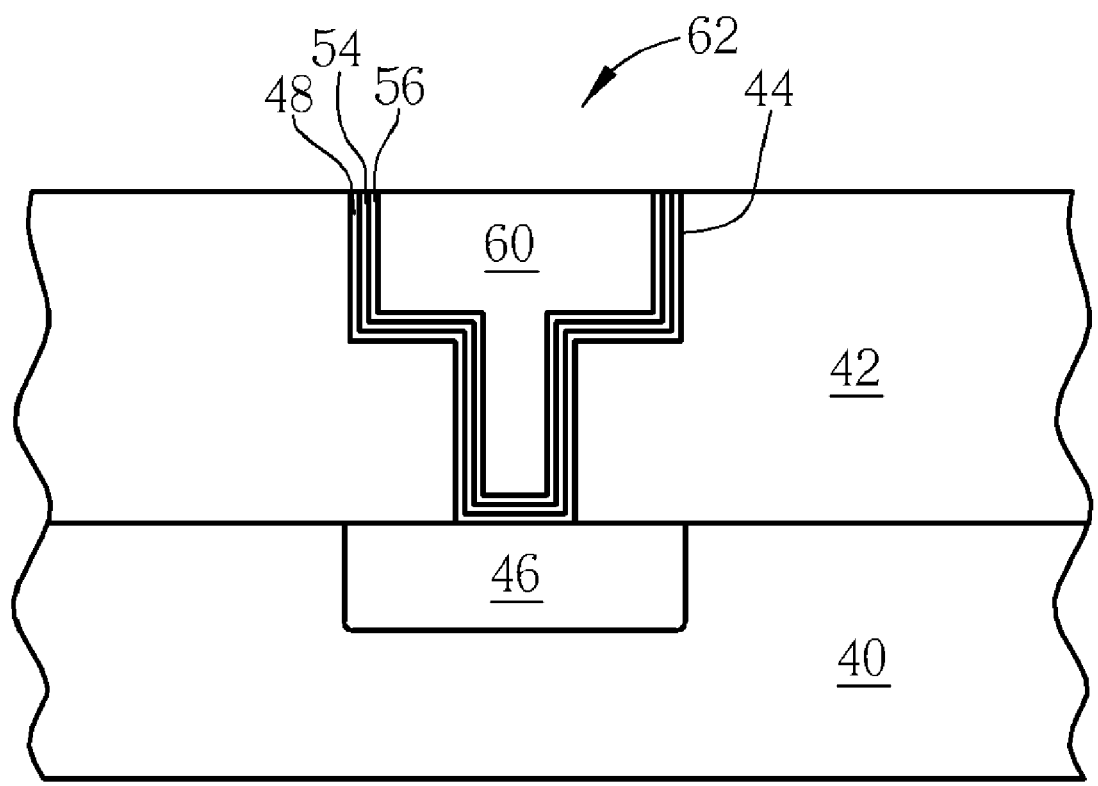

Then, an electrochemical deposition (ECD) process is performed to form a copper layer 60 in the dual-damascene hole 44. During the deposition process, the seed layer 58 becomes a portion of the copper layer 60, as shown in FIG. 8. Finally, a planarization process, such as a chemical mechanical polishing (CMP) process, is performed by taking the dielectric layer 42 as a stop layer to make the surface of the copper layer 60 approximately coplanar with the surface of the dielectric layer 42. Therefore the fabrication of the dual-damascene copper structure 62 formed directly on the semiconductor substrate 40 is complete.

In this embodiment, the tantalum nitride layer 54 formed with the atomic CVD process has a preferable conformance and step coverage, as well as the ability of prevent copper diffusion. Since the dual-damascene copper structure 62 is fabricated directly on the semiconductor substrate 40, ammonia, the precursor of the atomic CVD process for forming the tantalum nitride layer 54, may damage the surface of the semiconductor substrate 40 through reacting with silicon atoms. As a result, the substrate-protecting layer 48 has to be formed on the surface of the exposed semiconductor substrate 40 before forming the tantalum nitride layer 54 to protect the semiconductor substrate 40. On the other hand, this embodiment is different in that the distance $H_1$ between the target 50 and the semiconductor substrate 40 is more than 5 cm during the sputtering process, so that the substrate-protecting layer 48 can have preferable conformance. Similarly, when forming the adhesion layer 56, the metal target 64 has a long distance $H_2$ from the semiconductor substrate 40 which is about 10-50 cm to make the sputtering process have better performance.

Figure 9:
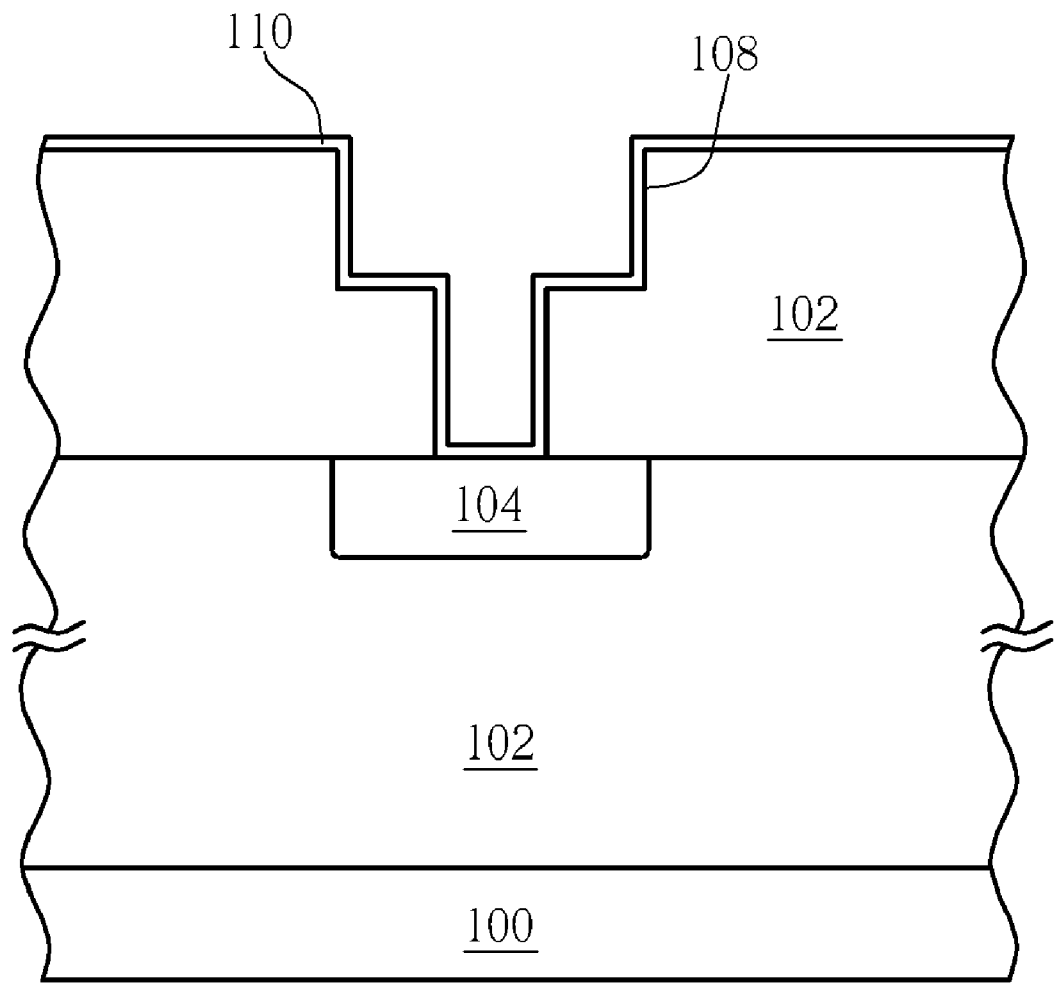
FIGS. 9-10 are schematic views of forming a dual-damascene copper structure according to another embodiment of the present invention.
Figure 10:
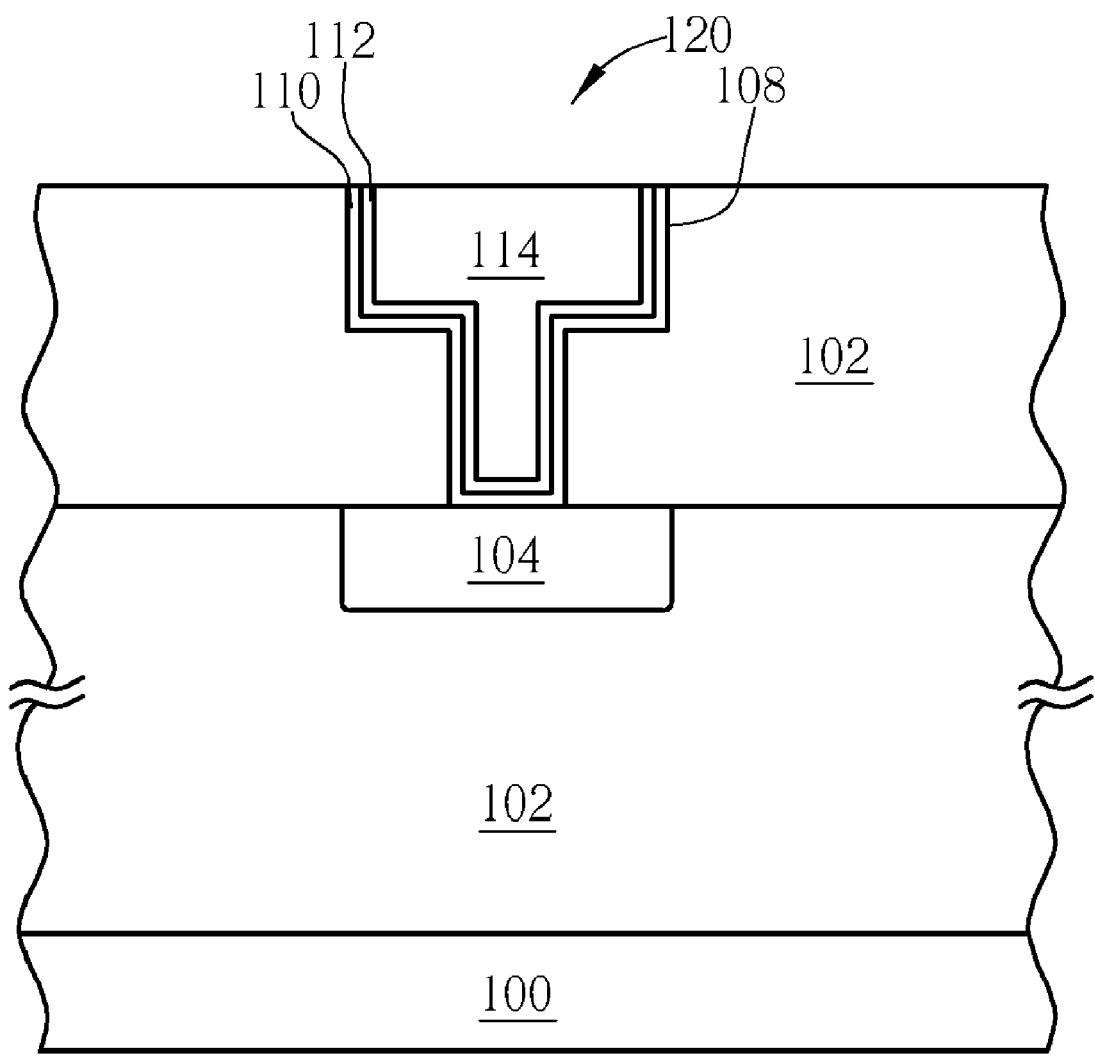

Please refer to FIGS. 9-10. FIGS. 9-10 are schematic views of forming a dual-damascene copper structure according to another embodiment of the present invention. First, a substrate 100 is provided, wherein the substrate 100 has at least a conductive layer 104 and at least a dielectric layer 102 thereon, as shown in FIG. 9. The conductive layer 104 is composed of aluminum (Al), copper (Cu), Al—Cu alloy, silicide, or combinations thereof. Then, at least a dual-damascene hole 108 is formed in the dielectric layer 102 to expose a portion of the conductive layer 104.

An atomic CVD process is next performed to form a tantalum nitride layer 110 on the sidewall of the dual-damascene hole 108 and the exposed conductive layer 104, wherein ammonia and PDMAT may be selected to be the precursors of the atomic CVD process for forming the tantalum nitride layer 110 as a first barrier layer. It should be noted that the thickness of the tantalum nitride layer 110 is about 8-28 angstroms (Å) in the dual-damascene hole 108.

Referring to FIG. 10, a PVD process is performed to form a tantalum layer 112 on the surface of the tantalum nitride layer 110. During the PVD sputtering process, a target containing tantalum has a distance away from the substrate 100 of about 10-50 cm. The tantalum layer 112 serves as a second barrier layer and has good adhesion ability to the following formed metal seed layer. Then, a metal seed layer is formed on the surface of the substrate 100 and the dual-damascene hole 108, and a copper layer 114 is sequentially formed through the metal seed layer. Finally, a CMP process is performed to complete the fabrication of the dual-damascene copper structure 120.

In contrast to the prior art, the present invention method adopts the atomic CVD process to form the tantalum nitride layer with preferable ability to block copper atoms as a barrier layer in the dual-damascene copper structure. In addition, combining the tantalum nitride layer formed through the atomic CVD process along with the substrate-protecting layer and the adhesion layer formed under specific process conditions, such as controlling the distance between the target and the semiconductor substrate during the PVD process, makes the dual-damascene copper structure have preferable performance. Accordingly, the current leakage problem is improved. Therefore, the dual-damascene copper structure fabricated through the present invention has low resistance so that the chip has better performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a dual-damascene copper structure, the method comprising:
   providing a semiconductor substrate having at least a dielectric layer thereon and at least a dual-damascene hole positioned in the dielectric layer and directly on the semiconductor substrate, a portion of the semiconductor substrate being exposed in a bottom of the dual-damascene hole, a surface of the exposed portion of the semiconductor substrate further comprising a conductive layer composed of silicide;
   performing a physical vapor deposition (PVD) process to form a conductive substrate-protecting layer on the exposed portion of the semiconductor substrate and a sidewall of the dual-damascene hole;
   performing an atomic chemical vapor deposition (CVD) process to form a tantalum nitride (TaN) layer on a surface of the substrate-protecting layer, the TaN layer serving as a barrier layer; and
   forming a copper layer in the dual-damascene hole.

2. The method of claim 1, wherein the substrate-protecting layer is used for protecting a surface of the semiconductor substrate when performing the atomic CVD process.

3. The method of claim 2, wherein the substrate-protecting layer is composed of tantalum (Ta), titanium (Ti), or tantalum nitride (TaN).

4. The method of claim 1, wherein the PVD process is a sputtering process, and a distance between a target of the sputtering process and the semiconductor substrate is more than 5 centimeters when performing the PVD process.

5. The method of claim 1, wherein the method further comprises forming an adhesion layer on a surface of the tantalum nitride layer for promoting the formation of the copper layer.

6. The method of claim 5, wherein the step of forming the adhesion layer comprises performing a PVD process.

7. The method of claim 5, wherein the adhesion layer is a tantalum layer.

8. The method of claim 1, wherein a temperature of the atomic CVD process is about 180° C.-400° C.

9. The method of claim 1, wherein precursors of the atomic CVD process comprise pentakis (dimethylamido) tantalum (PDMAT) and ammonia ($NH_3$).

10. The method of claim 1, wherein the method further comprises forming a metal seed layer on the tantalum nitride layer before forming the copper layer, and performing a chemical mechanical polishing (CMP) process after forming the copper layer.

11. The method of claim 1, wherein a surface of the semiconductor substrate further comprises a silicide layer, a portion of the silicide layer being exposed when the dual-damascene hole is formed.

12. A method of fabricating a dual-damascene copper structure, the method comprising:
   providing a semiconductor substrate having at least a conductive layer and at least a dielectric layer thereon;
   forming at least a dual-damascene hole directly on the semiconductor substrate and positioned in the dielectric layer and exposing a portion of the conductive layer in the dual-damascene hole, a surface of the exposed portion of the conductive layer composed of silicide;
   performing a PVD process for forming a conductive substrate-protecting layer on surfaces of the dual-damascene hole and the conductive layer;
   performing an atomic CVD process to form a tantalum nitride layer on a sidewall of the dual-damascene hole and on the exposed conductive layer;
   performing a PVD process to form a tantalum layer on the tantalum nitride layer; and
   forming a copper layer in the dual-damascene hole;
   wherein the substrate-protecting layer is used for protecting the substrate during the atomic CVD process.

13. The method of claim 12, wherein the conductive layer is composed of aluminum (Al), copper (Cu), Al—Cu alloy, silicide, or combinations thereof.

14. The method of claim 12, wherein the PVD process is a sputtering process, and a distance between a target of the sputtering process and the substrate is about 10-50 centimeters when performing the PVD process.

15. The method of claim 12, wherein a temperature of the atomic CVD process is about 180° C.-400° C.

16. The method of claim 12, wherein precursors of the atomic CVD process comprise PDMAT and ammonia.

17. The method of claim 12, wherein a thickness of the tantalum nitride is about 8-28 angstroms (Å).

18. The method of claim 12, wherein the method further comprises forming a metal seed layer on a surface of the tantalum nitride layer before forming the copper layer, and performing a CMP process after forming the copper layer.

19. The method of claim 12, wherein the conductive layer is a silicon substrate.

20. The method of claim 12, wherein the substrate-protecting layer is composed of Ta, Ti, or TaN.

21. The method of claim 12, wherein the conductor layer is directly in contact with a surface of the semiconductor substrate.

* * * * *